United States Patent [19]
Kazuo

[11] Patent Number: 5,172,202
[45] Date of Patent: Dec. 15, 1992

[54] SIMICONDUCTOR MEMORY CELL HAVING HIGH DENSITY STRUCTURE

[75] Inventor: Terada Kazuo, Tokyo, Japan

[73] Assignee: NEC Corporation, Tokyo, Japan

[21] Appl. No.: 859,253

[22] Filed: Mar. 26, 1992

Related U.S. Application Data

[63] Continuation of Ser. No. 531,365, May 31, 1990, abandoned.

[30] Foreign Application Priority Data

May 31, 1989 [JP] Japan ................................. 1-137841
May 31, 1989 [JP] Japan ................................. 1-137842

[51] Int. Cl.⁵ ...................... H01L 29/78; H01L 23/50
[52] U.S. Cl. .................................... 257/306; 257/758
[58] Field of Search ...................... 357/23.1, 23.6, 51, 357/71

[56] References Cited

U.S. PATENT DOCUMENTS 4,970,564 11/1990 Kimura et al. ................. 357/23.6

FOREIGN PATENT DOCUMENTS 63-278363 11/1988 Japan ............................. 357/23.6

OTHER PUBLICATIONS

Kimura et al. *IEDM* 1988, pp. 596–599 "A New Stacked Capacitor DRAM . . . Structure".
T. Ema et al, "3-Dimensional Stacked Capacitor Cell for 16M and 64M DRAMs", IEDM Technical Digest, pp. 592–595 (1988).

*Primary Examiner*—Jerome Jackson, Jr.
*Attorney, Agent, or Firm*—Sughrue, Mion, Zinn, Macpeak & Seas

[57] ABSTRACT

In a semiconductor memory cell of a DRAM comprising a stacked cell capacitor constructed upon word and bit lines, the stacked cell capacitor is not directly connected to a transistor to the device isolator area is provided. Through this wiring, the diffusion layer of the transistor is connected to the stacked cell capacitor. Also, a bit line is constructed on the active region to cross the connection point between the transistor, local wiring and gate electrode.

3 Claims, 12 Drawing Sheets

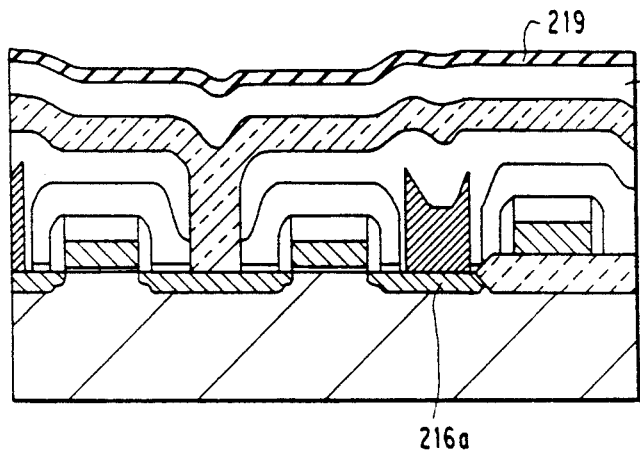
FIG. 4e
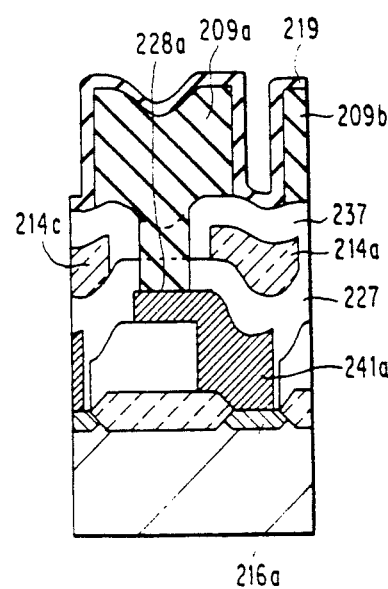
FIG. 4f
FIG. 5
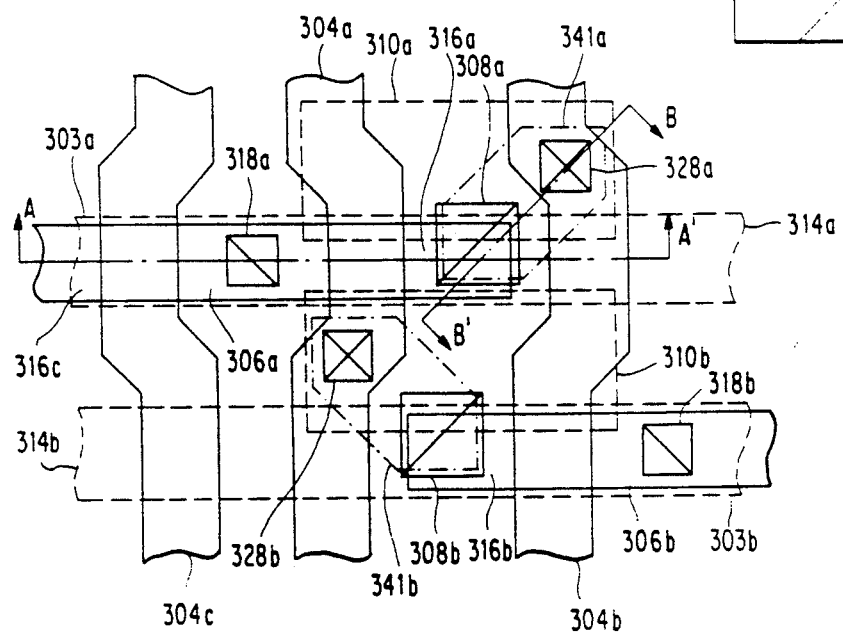

SEMICONDUCTOR MEMORY CELL HAVING HIGH DENSITY STRUCTURE

This is a continuation of application Ser. No. 07/531,365 filed May 31, 1990 now abandoned.

BACKGROUND OF THE INVENTION

The present invention relates to a semiconductor memory cell and, more particularly, to a semiconductor memory cell of a dynamic random access memory (DRAM) device composed of a single transistor and a stacked capacitor.

In 1970, a 1 kbit DRAM using for each cell three transistors and a charge-storing capacitor, referred to as 3T cell hereinafter, was invented. Since then, the history of the DRAM as a semiconductor memory of large capacity and low cost has evolved. Before that time, a flip-flop type SRAM was used as a semiconductor memory. If a MOSFET is used for the memory cell of an SRAM, 6 transistors or 4 transistors with two resistors are necessary. In contrast, the 3T cell of a DRAM uses only three transistors, so that it is more suitable for a semiconductor memory of large capacity having a small surface area. For a 4 kbit memory, the 3T cell has been replaced by a single transistor memory cell, referred to as 1T cell in the following, which is composed of a single transistor and a single capacitor. Thereafter, the technical improvement in the circuit design, device design, fine manufacturing and fabrication process has made a fourfold increase in the memory capacity of a DRAM with a 1T cell possible over a three year period. The scalling rule proposed in 1974 has promoted the technical improvement.

In 1978, a soft error phenomenon due to misoperation occurring on the occasion of invasion of alpha particles into the semiconductor was discovered, with the result that the design method of 1T cell has been obliged to change. Until that time, it was considered that the improvement in the fine manufacturing process and the development of the circuit design technique of a sense amplifier could decrease the capacitor composed of a 1T cell, referred to as a cell compacitor hereinafter, to a value assuring a stable read operation. However, it has been disclosed that in order to protect against soft error the cell capacitor has some lower limit. In other words, the cell capacitor has the necessary minimum value for protecting against soft error, in addition to the necessary minimum value conventionally known as value for assuring the stable read-out. For a DRAM with a capacity larger than 64 kbit, the necessary minimum value for protecting against soft error becomes a more significant factor for determining the cell capacitor, than that for assuring the stable read-out. Thus, the scaling rule cannot be applied to the cell capacitor. Consequently, since the area of memory cell cannot be decreased below some certain limit, the increase in memory capacity of a DRAM causes the gradual increase in memory chip surface area.

In 1982, a trench capacitor technique was developed, whereby the electrode area of the cell capacitor was increased by fabricating the capacitor in a trench. Resorting to this technique, the transistor area of a 1T cell can be decreased even though the cell capacitor remains as it is. This technique introduced the concept of three-dimensional design of a cell capacitor.

In order to enlarge the capcity of a DRAM using this technique, the size of the aperture of the trench capacitor should be made small and the depth of the trench should be made deep, however, the limitations of the processing technique may not afford a structure of this kind.

Recently, the stacked cell capacitor has entered into the limelight to overcome the limitations of the above-mentioned trench capacitor technique.

The construction of a 1T cell DRAM comprising a stacked cell capacitor is the same as that of the conventional 1T cell with respect to the transistor, word line and bit line. The surface of a P-type silicon substrate or a P-well fabricated upon a silicon substrate is divided into a device isolator region and an active region by, for example, LOCOS oxide film. The word lines are disposed nearly perpendicular to the longitudinal direction of the active region, while the bit lines are disposed nearly parallel to the active region. A transistor is fabricated in the active region. The transistor is composed of a gate electrode formed of a part of the word line, and first and second electrodes of N-type diffusion regions formed in a self-aligned relation with the gate electrode. The bit line is connected to the first electrode through the first contact hole. In a 1T cell DRAM comprising a stacked cell capacitor, its lower electrode is connected to the second electrode of the transistor through the second contact hole.

In the original 1T cell DRAM comprising a stacked cell capacitor, the bit line is disposed on the uppermost layer and the cell capacitor is disposed on the intermediate layer between the bit and word lines. The depth of the cell capacitor is sufficiently deep compared with those of the wiring layers, such as the bit and word lines. Accordingly, the size of the aperture of the first contact hole is small and its depth is extremely deep. As a result, a structure of this kind encounters the same problems associated with the trench structure.

Recently, in order to solve the aforementioned problem, a new structure of a 1T cell DRAM comprising a stacked cell capacitor has been proposed. Examples of this structure are shown in the IEDM Technical Digest, pp. 592–595 (1988) and the IEDM Technical Digest, pp. 595–599 (1988). In these structures, the cell capacitor is disposed on the uppermost layer, and the bit line is disposed on the intermediate layer between the cell capacitor and the word line. Moreover, in these structures, the bit and word lines are disposed so as to avoid the upper surface of the second electrode while at the same time surrounding it. Therefore, the shape of the insulator film covering the bit line, word lines and the second electrode in the vicinity of the second contact hole constitutes a deep hollow. The second contact hole is constructed in the bottom of this deep hollow. Since the bit line is constructed above the word line, the depth of the deep hollow largely depends on the position of the bit line.

In the above-mentioned new structure of a 1T cell DRAM comprising a stacked cell capacitor, the distance between the bit line and the second contact hole is important. Thus, since the distance between neighboring bit lines is required to be large, the cell size of the memory device is limited.

Also, the position of the cell capacitor is determined by the position of the second contact hole, so that the disposition of the cell capacitor is limited.

Furthermore, although the thickness of the insulator film on the aperture of the second contact hole does not cause any problem, the controllability of the photolithography including the etching process is not sufficient because of the large thickness of the insulator film in the vicinity of the aperture portion.

BRIEF SUMMARY OF THE INVENTION

The first object of the present invention is to provide a structure of a small cell size for a 1T cell of a semiconductor memory comprising a stacked cell capacitor, wherein the cell capacitor is disposed on the uppermost layer and the bit line is disposed on the intermediate layer between the cell capacitor and the word line.

The second object of the present invention is to provide a structure having a high freedom of cell capacitor disposition for a 1T cell of a semiconductor memory comprising a stacked cell capacitor, wherein the cell capacitor is disposed on the uppermost layer and the bit line is disposed on the intermediate layer between the cell capacitor and the word line.

The third object of the present invention is to provide a structure which allows easy fabrication of the second contact hole disposed below the lower electrode of the cell capacitor for the 1T cell of a semiconductor memory comprising a stacked cell capacitor, wherein the cell capacitor is disposed on the uppermost layer and the bit line is disposed on the intermediate layer between the cell capacitor and the word line.

SUMMARY OF THE INVENTION

In a semiconductor memory 1T cell comprising a stacked cell capacitor of the present invention, which has such a structure that the cell capacitor is disposed on the uppermost layer and that the bit line is disposed on the intermediate layer between the cell capacitor and the word line, a local contact hole is fabricated in the second electrode of the transistor and a local wiring is connected to the second electrode through the local contact hole. One end of the local wiring is disposed in the local contact hole, while the other end of it is disposed on the device isolator area. The bit line connected to the first electrode of the transistor through the first contact hole is disposed above the gate electrode composed of the word line and also above the local wiring on the local contact. A second contact hole is disposed above the other end of the local wiring, through which the lower electrode of the cell capacitor is connected to the local wiring. Thus, the lower electrode of the cell capacitor is connected to the second electrode through the second contact hole, the local wiring and the local contact hole.

The other end of the local wiring is either above the insulator film between the word line and the neighboring word line, or above the neighboring word line, or a position crossing the neighboring word line.

The first fabrication method of a semiconductor memory cell according to the present invention comprises the following processes. A device isolator area and as active area are simultaneously fabricated upon a silicon substrate surface. A word line covered by an insulator film having portions serving as gate electrodes is constructed, and the first and second electrodes are constructed in the active region. The first interlayer insulator film is deposited, which is an interlayer insulator film between the word line and the local wiring. A local contact is made on this interlayer insulator film above the second electrode, and then a local wiring is constructed. The second interlayer insulator film is deposited, which is an interlayer insulator film between local wiring and bit line. The first contact hole is constructed upon the first and second interlayer insulator films above the first electrode, and then the bit line is constructed. The third interlayer insulator film is deposited, which is an interlayer insulator film between bit line and cell capacitor. The second contact hole is constructed upon the second and third interlayer insulator films above the other end of the local wiring. The lower electrode of the cell capacitor is then constructed. The insulator film deposited upon the disclosed surface of the word line is preferably a silicon oxide film formed by high temperature chemical vapor growth. The side wall portion of the insulator film deposited upon the disclosed surface of the word line is a silicon nitride film. The first, second and third interlayer insulator films are preferably BPSG films.

The second fabrication method of a semiconductor memory cell according to the present invention comprises the following processes, instead of the deposition of the first interlayer insulator film in the above-mentioned first method. The embedded insulator film is deposited between word lines so as to make the surface flat. This film is either a silicon nitride film or a silicon oxide film formed by low temperature chemical vapor growth. In the case where the silicon nitride film is utilized, the side wall portion of the insulator film deposited upon the disclosed surface of the word line is preferably a silicon oxide film.

In a semiconductor memory cell of the present invention, a local contact and local wiring is provided, and a bit line is constructed upon the active region. Also, it comprises the second contact hole upon the local wiring above the device isolator region. In other words, the position of the second contact hole is altered from above the second electrode to the local wiring on the device isolator region. Therefore, although the thickness of the insulator film constituting the second contact hole of the present invention is almost the same as the conventional case, the gradient of the hollow of the insulator film in the vicinity of the second contact hole is as small as the conventional case. Consequently, the spacing between bit lines can be decreased, so that the cell size can be made smaller.

Also, since the position of the other end of the local wiring can be determined without limitation, the freedom of disposition of the cell capacitor is assured.

Moreover, since the gradient of the hollow of the insulator film in the vicinity of the second contact hole is as small as the conventional case, the controllability of the photolithography process including the etching process to make the second contact hole can be improved. Accordingly, the connection between the lower electrode of the cell capacitor and the second electrode of the transistor can easily be made.

BRIEF DESCRIPTION OF THE ACCOMPANYING DRAWINGS

The above-mentioned and other object, features of, and advantages of this invention will become more apparent by reference to the following detailed description of the invention taken in conjuction with the accompanying drawings, wherein:

FIGS. 4a to 4f are cross-sectional views for explaining the main processes of the fabrication method of the semiconductor memory cell according to the first embodiment of the present invention, where FIGS. 4a, 4c and 4e are cross-sectional views along the single-dotted line AA' in FIG. 3, while FIGS. 4b, 4d and 4f are cross-sectional views along the singled-dotted line BB' in FIG. 3;

FIG. 5 is a plain view for explaining a semiconductor memory cell according to the second embodiment of the present invention;

FIGS. 6a, 6c and 6e are cross-sectional views along the single-dotted line AA' in FIG. 5, while FIGS. 6b, 6d and 6f are cross-sectional views along the singled-dotted line BB' in FIG. 5;

DETAILED DESCRIPTION OF THE PREFERRED EMBODIMENTS

Referring to FIGS. 1, 2a, 2b and 2c, the construction and fabrication method of a conventional semiconductor memory cell will be explained. A semiconductor memory cell of this kind is a 1T cell of DRAM comprising a cell capacitor disposed on the uppermost layer and bit line disposed between the cell capacitor and the word line. The construction of this was described in an article disclosed in IEDM Technical Digest pp. 592-595 (1988). Since the detail of the fabrication method of this semiconductor memory cell is not obvious, it will be explained while correspondingly referring to the content of the first embodiment of the present invention. The pattern design and the processing are performed by using a 0.6 micron rule.

Figure 1:
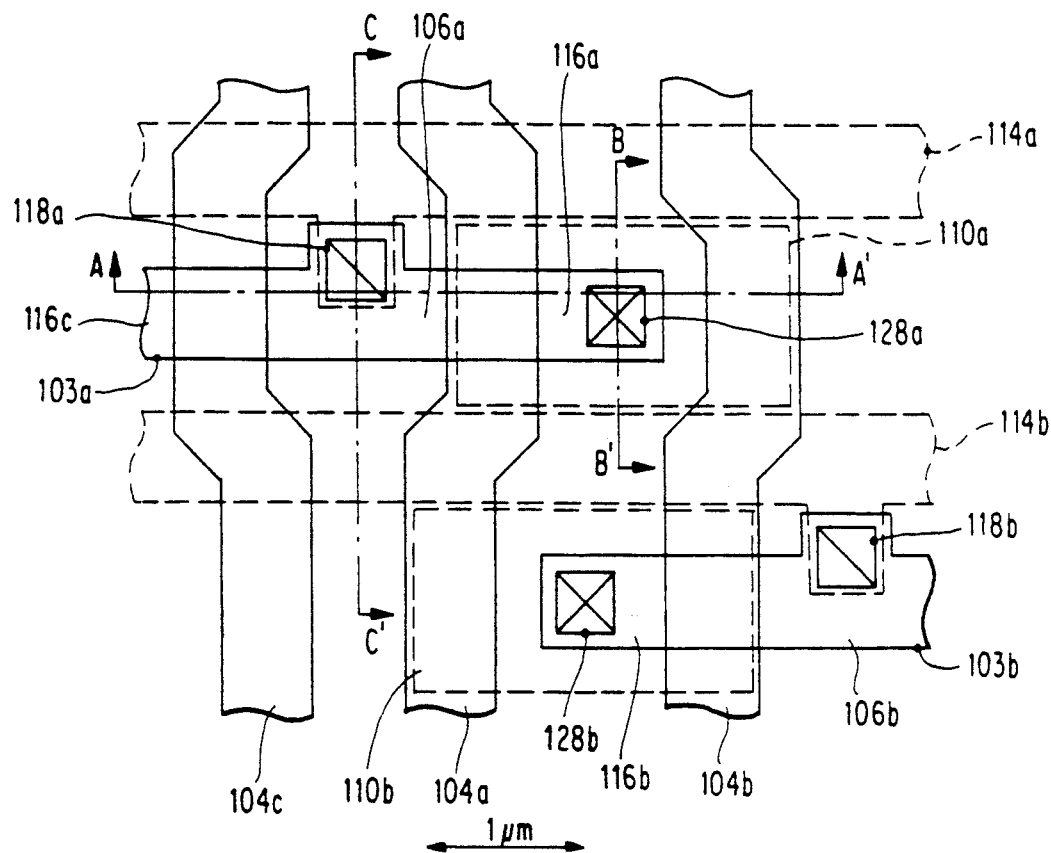
FIG. 1 is a plain view for explaining the conventional semiconductor memory cell.

At first, the mutual connection between the transistor, cell capacitor, and wiring will be explained with reference to FIG. 1, which is a plain view showing a 2 bit memory cell. A field oxide film deposited on the surface of a silicon substrate by, for example, the LOCOS method, specifies a device isolator region and an active region. The transistors are constructed inside the active region borders 103a and 103b separating device isolator region and active region. The word lines 104a, 104b and 104c are disposed nearly perpendicular to the longitudinal direction of the active region. These word lines 104a, 104b and 104c work as the gate electrodes of the transistors as well. The transistors are constituted by these gate electrodes, the first electrodes 106a and 106b, and the second electrodes 116a, 116b and 116c of N-type diffusion layer. The first contact holes 118a and 118b are constructed on the first electrodes 106a and 106b. The bit lines 114a and 114b are disposed nearly parallel with the longitudinal direction of the active region on the field oxide film. The bit line 114a is connected to the first electrode 106a through the first contact hole 118a, while the bit line 114b is connected to the first electrode 106b through the first contact hole 118b. The second contact holes 128a and 128b are disposed above the second electrodes 116a and 116b. A cell capacitor 110a disposed between the bit lines is connected to the second electrode 116a through the second contact hole 128a, while a cell capacitor 110b disposed between the bit lines is connected to the second electrode 116b through the second contact hole 128b. The bit line is separated from the active region border except at the second contact hole portion.

Figure 2A:
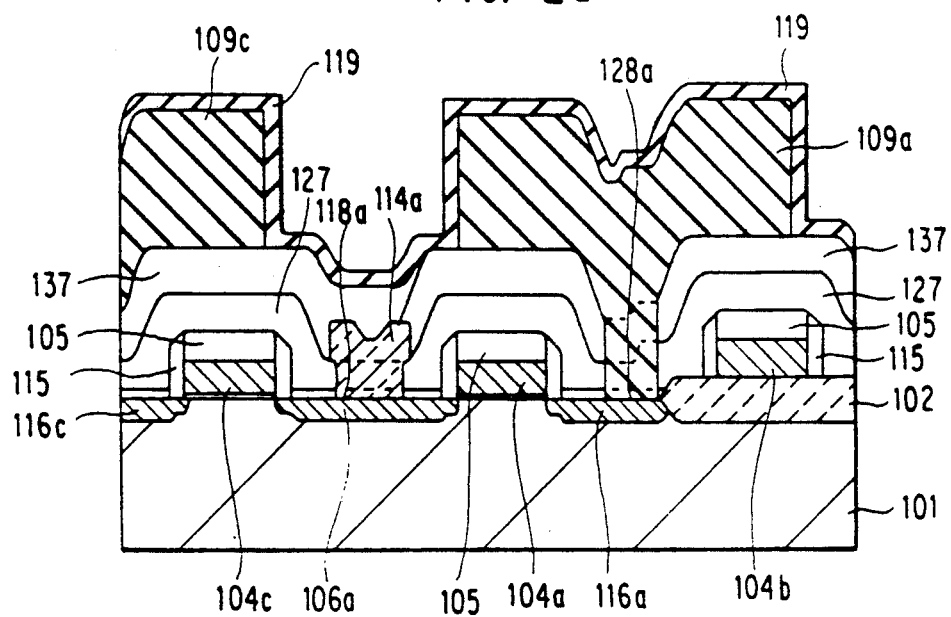
FIGS. 2a, 2b and 2c are cross-sectional views along the single-dotted lines AA', BB' and CC' in FIG. 1.
Figure 2B:
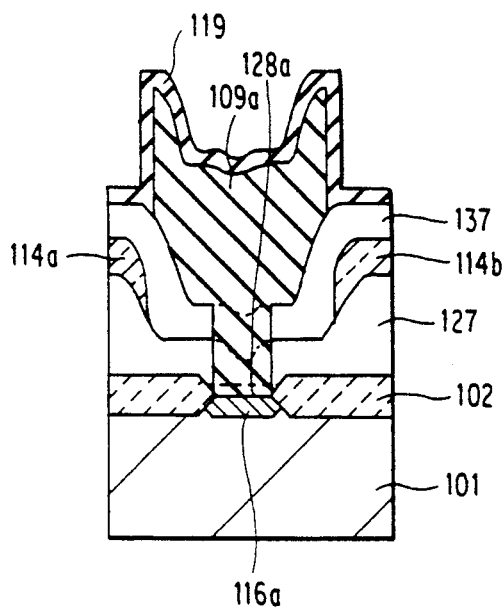
Figure 2C:
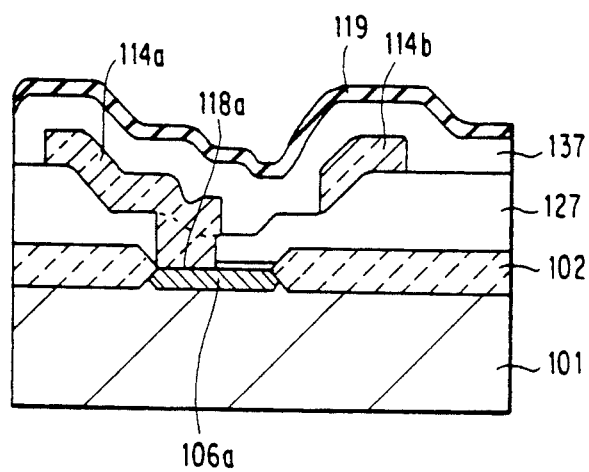

Next, the fabrication method of the conventional semiconductor memory cell will be explained with reference to FIGS. 1, 2a, 2b and 2c. FIGS. 2a, 2b and 2c are the cross-sectional views along the single-dotted lines AA', BB' and CC' in FIG. 1, respectively.

At first, a field oxide film 102 having a thickness of about 300 nm is deposited on, for example, a P-type silicon substrate 101 by means of, for example, the LOCOS method. After depositing a gate insulator film of a thickness of about 10 nanometers calculated in terms of the silicon oxide film, a N-type polysilicon film is then deposited upon the film 102 having a thickness of about 250 nanometers. Then, a silicon oxide film 105 referred to as HTO film in the following is deposited by means of a high temperature chemical vapor growth having a thickness of about 200 nanometers. The word lines 104a, 104b and 104c are constructed by processing the HTO film 105 and N-type polysilicon film by means of photolithography. The width (that is, gate length) of it is 0.6 micrometers. A $N^-$ type diffusion layer is deposited by means of ion injection using word lines 104a, 104b and 104c as a mask. A side wall 115 of the HTO film is constructed at the sides of word lines 104a, 104b and 104c having a thickness of about 100 nanometers. A $N^+$ type diffusion layer is deposited by means of ion injection. Thus, the first electrodes 106a and 106b, and the second electrodes 116a, 116b and 116c of LDD structure are constructed.

Next, a silicon oxide film having a thickness of about several tens of nanometers is deposited on the surface of the first electrodes 106a and 106b, and the second electrodes 116a, 116b and 116c by thermal oxidation. Then, a BPSG film 127 is deposited, which becomes an interlayer insulator film between the word and bit lines, having a thickness of about 250 nanometers. By making a hole in the BPSG film above the first electrodes 106a and 106b and the thermal oxide film by means of an etching process, the first contact holes 118a and 118b are constructed. Then, a polycide film is deposited having a thickness of about 250 nanometers. The bit lines 114a and 114b are constructed by etching the polycide film.

Succeedingly, a BPSG film 137 is deposited, which becomes an interlayer insulator film between the bit lines and the cell capacitor, having a thickness of about 250 nanometers. The second contact holes 128a and 128b are constructed by etching the BPSG films 137 and 127, and the thermal oxidation film above the second electrodes 116a and 116b. Above the second contact hole, the lower electrodes 109a and 109c of a stacked cell capacitor of N-type polysilicon are constructed. The height of these electrodes is about 1.8 micrometers. Although the structure of these electrodes is a fin structure, it is shown more simplified. The capacitor insulator film (not shown) having a thickness of about 5 nanometers calculated in terms of the silicon oxide film is deposited. A plate electrode 119 of N-type polysilicon, which is the upper electrode of the stacked cell capacitor is constructed, having a thickness of about 100 nanometers. Thus, the stacked cell capacitors 110a and 110b composed of a plate electrode, capacitor insulator film and lower electrode are constructed. The lower electrodes of the cell capacitors 110a and 110b are connected to the second electrodes 116a and 116b through the second contact holes 128a and 128b. The explanation of the succeeding process will be omitted.

As is shown in FIG. 2c, the narrowest portion between bit lines 114a and 114b is the portion where the first contact hole 118a is constructed. The distance between the first contact hole 118a and bit line 114b is determined not only by the working precision of the etching. The portion of BPSG film 127 below bit line 114b has a step difference of about 300 nanometers, this step difference results from the shape of BPSG film 127 covering the word lines 104a and 104b. Due to the existence of this step difference, the distance between the first contact hole 118a and bit line 114b is chosen to be larger than determined by the working precision of the etching.

As is shown in FIG. 2b, the second contact hole 128a is constructed under a more severe condition. In other words, the second contact hole is constructed in the bottom of a step difference of 700 nanometers. This step difference is the sum of the step difference of BPSG film 127 caused by the thickness of word line 104b and that of BPSG film 137 caused by the thickness of the bit lines 114a and 114b. Although the step difference can be made smaller by getting bit line 114a closer to bit line 114b, this results in that the film thickness of the aperture portion of the BPSG films 137 and 127 increases above 1 micrometer. Therefore, as long as the structure of this kind is employed, the controllability of the development process and etching process in the photolithography procedure w. The spacing between the bit lines is affected more by the second contact hole than by the first contact hole. Owing to this difficulty, the cell size can not be made small by utilizing the above-mentioned structure.

Now, a semiconductor memory cell according to the first embodiment of the present invention will be explained with reference to FIG. 3 and FIGS. 4a to 4f. The semiconductor memory cell is a 1T memory cell of DRAM comprising a stacked memory cell capacitor disposed on uppermost layers, and a bit line diposed between the cell capacitor and the word line. The pattern design and the processing are performed by using the 0.6 micrometer rule.

At first, the mutual connection between the transistor, cell capacitor and wiring will be explained with reference to FIG. 3, which is a plain view showing a 2 bit memory cell. A field oxide film deposited on the surface of a silicon substrate by, for example, LOCOS method specifies a device isolator region and active region. The transistors are constructed inside active region borders 203a and 203b separating device isolator region and active region. The word lines 204a, 204b and 204c are disposed nearly perpendicular to the longitudinal direction of the active region. The word lines 204a, 204b and 204c work as gate electrodes of transistors as well. The transistors are constituted by these gate electrodes, the first electrodes 206a and 206b, and the second electrodes 216a, 216b and 216c of N-type diffusion layer. The first contact holes 218a and 218b are constructed on the first electrodes 206a and 206b. The bit lines 214a and 214b are disposed nearly parallel with the longitudinal direction of the active region on the field oxide film. The bit line 214a is connected to the first electrode 206a through the first contact hole 218a, while the bit line 214b is connected to the first electrode 206b through the first contact hole 218b. The local contact holes 208a and 208b are disposed above the second electrodes 216a and 216b. The local wirings 241a and 241b are provided. One end of local wirings 241a and 241b are connected to the second electrodes 216a and 216b through local contact holes 208a and 208b, respectively, while the other end of them are on the field oxide film of the device isolator region. The second contact holes 228a and 228b are constructed on the other ends of local wiring 241a and 241b. A cell capacitor 210a disposed between bit lines is connected to the second electrode 216a through the second contact hole 228a, local wiring 241a and local contact hole 208a, while a cell capacitor 210b disposed between the bit lines is connected to the second electrode 216b through the second contact hole 228b, local wiring 241b and local contact hole 208b.

Next, the fabrication method of the semiconductor memory cell of the first embodiment of the present invention will be explained with reference to FIGS. 3 and 4a to 4f. FIGS. 4a, 4c and 4e are the cross-sectional views along with the single-dotted line AA' in FIG. 3, while FIGS. 4b, 4d and 4f are the cross-sectional views along with the single-dotted line BB' in FIG. 3.

Figure 3:
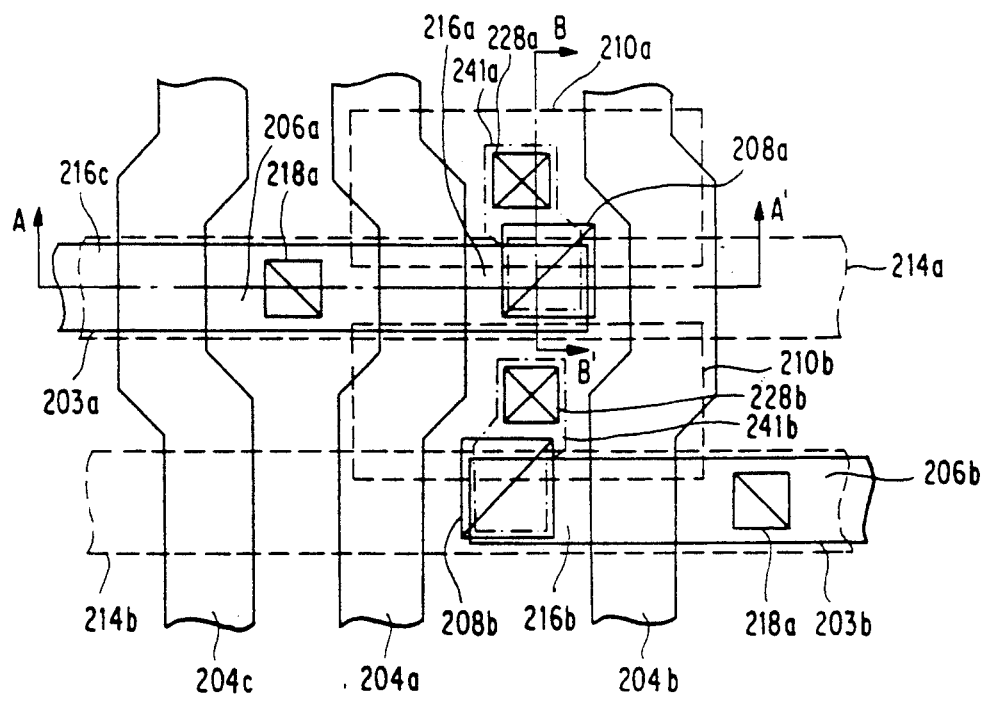
FIG. 3 is a plain view for explaining a semiconductor memory cell according to the first embodiment of the present invention.
Figure 4A:
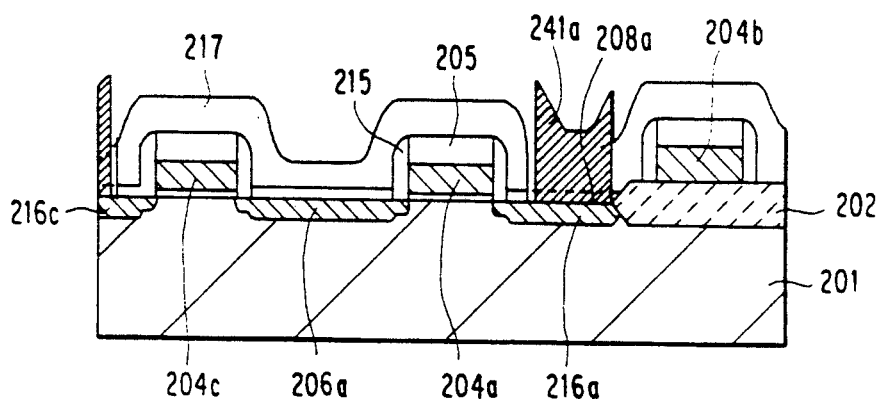
Figure 4B:
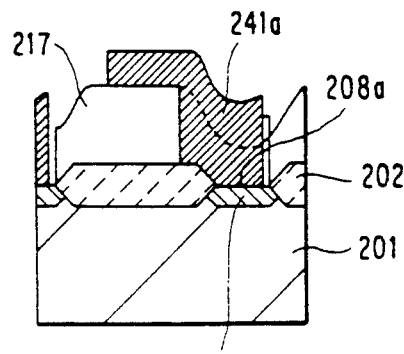
Figure 4C:
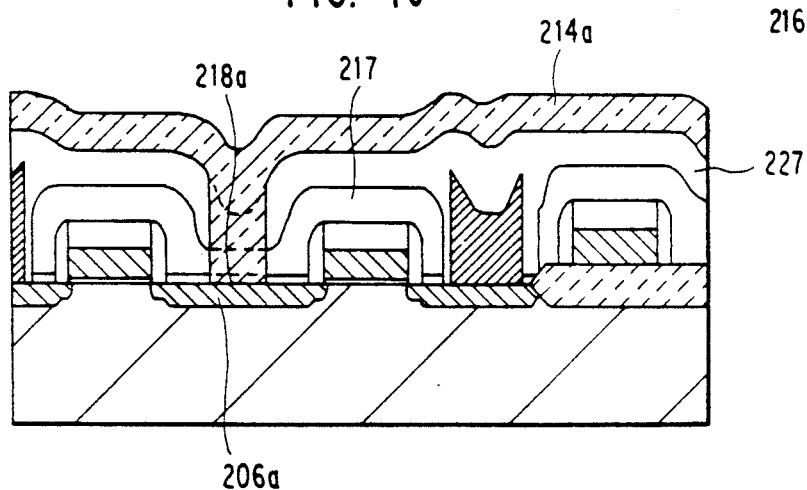

At first, as is shown in FIG. 3 and FIGS. 4a and b, a field oxide film 202 is deposited on, for example, a P-type silicon substrate 201 by means of, for example, LOCOS method. The thickness of it is about 300 nanometers. After depositing a gate insulator film having a thickness of about 10 nanometers calculated in terms of the silicon oxide film, a N-type polysilicon film is deposited upon the film 202. The thickness of it is about 250 nanometers. Then, a HTO film 205 is deposited, the thickness of which is about 200 nanometers. The word lines 204a, 204b and 204c are constructed by processing HTO film 205 and N-type polysilicon film by means of photolithography. The width (that is, gate length) of it is 0.6 micrometers. A $N^-$ type diffusion layer is deposited by means of ion injection using word lines 204a, 204b and 204c as a mask. A side wall 215 of HTO film is constructed at the sides of word lines 204a, 204b and 204c having a thickness of about 100 nanometers. A $N^+$ type diffusion layer is deposited by means of ion injection. Thus, the first electrodes 206a and 206b, and the second electrodes 216a, 216b and 216c of LDD structure are constructed.

Next, a silicon oxide film of about several tens of nanometers is deposited on the surface of the first electrodes 206a and 206b, and the second electrodes 216a, 216b and 216c by thermal oxidation. Then, a BPSG film 217 is deposited, which becomes the first interlayer insulator film between the word line and local wiring having a thickness of it is about 250 nanometers, and is then heat-treated at about 850 centigrades. By making a hole in the BPSG film 217 and the thermal oxide film above the second electrodes 216a and 216b by means of an etching process, the local contact holes 208a and 208b are fabricated. The thickness of the BPSG film 217 and the thermal oxide film at the aperture portion is about 250 nanometers. The step difference is small to the extent that the lithography process is not affected, with the result that the fabrication of the local contact hole is not difficult. The aperture portion may swell out from the second electrode, and on this occasion, the contact ion injection may be utilized. A N-type polysilicon film of about 250 nanometers is deposited, using a deposition method consisting of a combination of selective growth and normal growth methods. The local wirings 241a and 241b are constructed by etching the polysilicon film. One end of local wirings 241a and 241b are connected to the second electrodes 216a and 216b through local contact holes 208a and 208b, respectively, while the other ends exist on BPSG film 217 above the field oxide film 202.

Figure 4D:
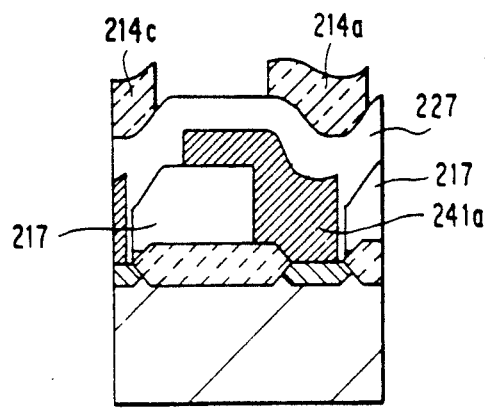

Now, as is shown in FIG. 3 and FIGS. 4c to 4d, a BPSG film 227 having a thickness of about 250 nanometers is deposited and then is heat-treated at about 850 centigrades, this becomes the second interlayer insulator film between word line and local wiring. By making a hole on the first electrode 206a, BPSG films 227 and 217, and the thermal oxide film on electrode 206a by means of etching, the first contact holes 218a and 218b are constructed. The thickness of the insulator film composed of BPSG films 227 and 217, and the thermal oxide film at the aperture portion, is from 500 to 750 nanometers. The step difference of the aperture portion relative to the peripheral insulator film is about 200 nanometers. Therefore, there is no difficulty in constructing the first contact hole. Next, a polycide film is deposited, the thickness of which is about 250 nanometers. The bit lines 214a and 214b are constructed by etching the polycide film. After tungsten or polysilicon is selectively deposited in the first contact hole, the polycide film may be deposited. On the surface of BPSG film 227 where the bit line is constructed, there are the hollows on the first contact hole and local contact hole. However, except for these areas the bit line does not exist along the plane inclined due to the hollow or step difference. Accordingly, the working precision for the bit line can be improved.

Next, as is shown in FIG. 3 and FIGS. 4e and 4f, a BPSG film 237 is deposited and is heat-treated at about 850 centigrades, this becomes the third interlayer insulator film between bit line and cell capacitor and has a thickness of about 250 nanometers. By etching the BPSG films 237 and 227 on the other ends of local wirings 241a and 241b, the second contact holes 228a and 228b are constructed on the other ends of the local wirings 241a and 241b. The thickness of the insulator film composed of BPSG films 237 and 227 at the aperture portion is about 500 nanometers. A step difference of the aperture portion relative to the peripheral portion of the insulator film is about 200 nanometers. Therefore, as is similar to the construction of the first contact hole, the construction of the second contact hole can easily be made. On the second contact hole the lower electrodes 209a and 209b of the stacked cell capacitor of polysilicon is constructed. The height of it is about 1.8 micrometers. Although the structure of it is fin type, it is shown more simplified. A capacitance insulator film of about 5 nanometers calculated in terms of the silicon oxide film (not shown) is deposited. The upper plate electrode 219 of the stacked cell capacitor of N type polysilicon is constructed having a thickness of about 100 nanometers. Thus, the stacked cell capacitors 210a and 210b composed of a plate electrode, a capacitance insulator film and a lower electrode are constructed. The lower electrodes of cell capacitors 210a and 210b are connected to the second electrodes 216a and 216b through the second contact holes 218a and 218b, local wirings 241a and 241b, and local contact holes 208a and 208b, respectively. The explanation of the succeeding process will be omitted.

In the first embodiment of the present invention, although the disposition pitch of the word lines is the same as the conventional cell, the disposition pitch of the bit lines (2.5 micrometers prior art) is decreased to 1.5 micrometers. Accordingly, the cell size is reduced to sixty percent of the conventional cell.

Moreover, although a P-type silicon substrate is used in the first embodiment, the above-mentioned semiconductor cell may also be constructed on a P-well fabricated on a silicon substrate.

Also, although the polysilicon, polycide and polysilicon are used as material for the word line, bit line and local wiring, respectively, they are not limited to the above-mentioned materials.

Instead of HTO film used as insulator film covering the upper surface and side wall, other insulator film having an etching rate slower than the BPSG film can be used.

Now, a semiconductor memory cell according to the second embodiment of the present invention will be explained with reference to FIG. 5 and FIGS. 6a to 6f. The semiconductor memory cell is a 1T memory cell of DRAM comprising a stacked memory cell capacitor disposed on the uppermost layer, and the bit line disposed between the cell capacitor and the word line. The pattern design and the processing are performed by using the 0.6 micrometer rule.

At first, the mutual connection between the transistor, the cell capacitor and the wiring will be explained with reference to FIG. 5, which is a plain view showing a 2 bit memory cell. A field oxide film deposited on the surface of a silicon substrate by, for example, the LOCOS method specifies a device isolator region and active region. The transistors are constructed inside active region borders 303a and 303b separating device isolator region and active region. The word lines 304a, 304b and 304c are disposed nearly perpendicular to the longitudinal direction of the active region. The word lines 304a, 304b and 304c work as gate electrodes of transistors as well. The transistors are constituted by these gate electrodes, the first electrodes 306a and 306b, and the second electrodes 316a, 316b and 316c of an N-type diffusion layer. The first contact holes 318a and 318b are constructed on the first electrodes 306a and 306b. The bit lines 314a and 314b are disposed nearly parallel with the longitudinal direction of the active region on the field oxide film. The bit line 314a is connected to the first electrode 306a through the first contact hole 318a, while the bit line 314b is connected to the first electrode 306b through the first contact hole 318b. The local contact holes 308a and 308b are disposed above the second electrodes 316a and 316b. The local wirings 341a and 341b are provided. One end of the local wirings 341a and 341b are connected to the second electrodes 316a and 316b through local contact holes 308a and 308b, respectively, while the other ends of them are disposed on the neighboring word lines 304b and 304a above the device isolator region. The second contact holes 328a and 328b are constructed on the other ends of local wiring 341a and 341b. A cell capacitor 310a disposed between the bit lines is connected to the second electrode 316a through the second contact hole 328a, local wiring 341a and local contact hole 308a, while a cell capacitor 310b also disposed between the bit lines is connected to the second electrode 316b through the second contact hole 328b, local wiring 341b and local contact hole 308b.

Figure 6A:
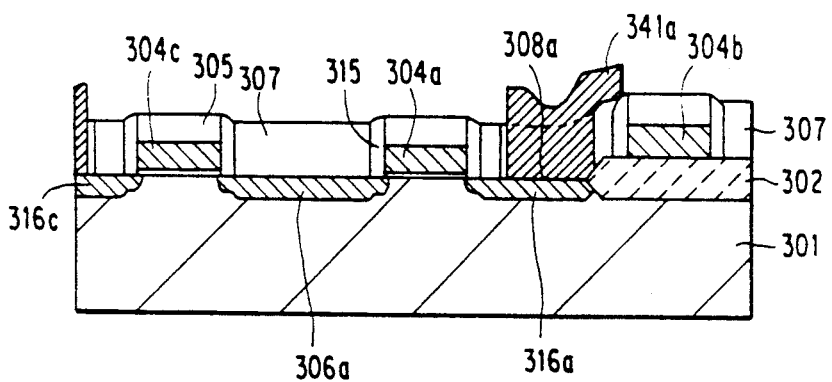
FIGS. 6a to 6f are cross-sectional views for explaining the main processes of the fabrication method of the semiconductor memory cell according to the second embodiment of the present invention, where

Next, the fabrication method of the semiconductor memory cell of the second embodiment of the present invention will be explained with reference to FIGS. 5 and FIGS. 6a to 6f. FIGS. 6a, 6c and 6e are cross-sectional views along the single-dotted line AA' in FIG. 5, while FIGS. 6b, 6d and 6f are cross-sectional views along the single-dotted line BB' in FIG. 3.

Figure 6B:
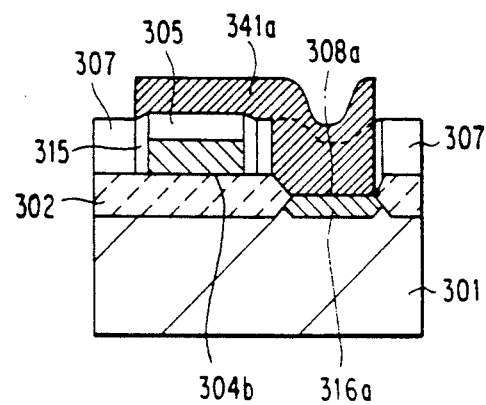
Figure 6C:
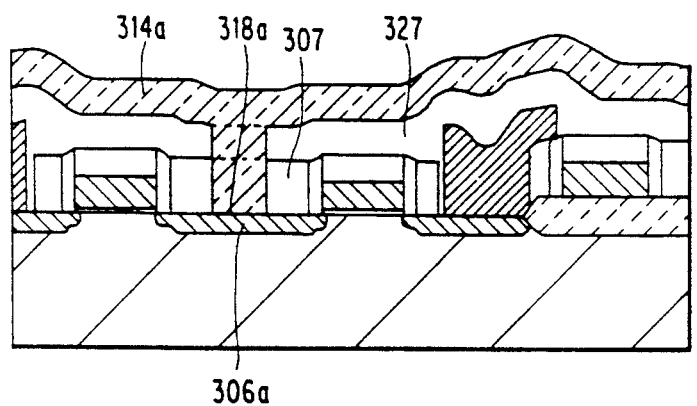

At first, as is shown in FIG. 5, FIG. 6a and FIG. 6b, a field oxide film 302 having a thickness of about 300 nanometers is deposited on, for example, a P-type silicon substrate 301 by means of, for example, the LOCOS method. After depositing a gate insulator film having a thickness of about 10 nanometers calculated in terms of the silicon oxide film, a N-type polysilicon film is deposited upon film 302, its thickness being about 250 nanometers. Then, a HTO film 305 is deposited, the thickness of which is about 200 nanometers. The word lines 304a. 304b and 304c are constructed by processing HTO film 305 and N-type polysilicon film by means of photolithography. The width (that is, gate length) of it is 0.6 micrometers. A N− type diffusion layer is deposited by means of ion injection using word lines 304a, 304b and 304c as a mask. A side wall 315 of HTO film is constructed at sides of word lines 304a, 304b and 304c. The thickness of it is about 100 nanometers. A N+ type diffusion layer is deposited by means of ion injection. Thus, the first electrodes 306a and 306b, and the second electrodes 316a, 316b and 316c of LDD structure are constructed.

Next, an embedded insulator film is deposited between the word lines. In this embodiment, a silicon oxide film referred to as LTO film in the following is deposited by means of low temperature chemical vapor growth method. Then, the space between word lines are flattened by applying a paint of, for example, styrene and by the etching back. The thickness of the LTO film is about 400 nanometers. In this case, the oxide film deposition on the first and second electrodes is not performed. However, if the insulator film is deposited by means of a plasma growth, instead of a LTO film, the thermal oxide film deposition is preferable. The embedded insulator film must have an etching rate higher than HTO films 305 and 315, but sufficiently slower than the BPSG film. By making a hole in the LTO film 307 above the second electrodes 316a and 316b by means of the etching process, the local contact holes 308a and 308b are constructed. Since the aperture portion of the LTO film is nearly flat, the fabrication of the local contact hole is not difficult. The aperture portion may swell out from the second electrode, on this occasion, the contact ion injection may be utilized. A N-type polysilicon film of about 250 nanometers is deposited using a deposition method consisting of a combination of selective growth and normal growth methods. The local wirings 341a and 341b are constructed by etching the polysilicon film. One end of the local wirings 341a and 341b are connected to the second electrodes 316a and 316b through local contact holes 308a and 308b, respectively, while the other ends of them exist on the neighboring word lines 304b and 304a above the device isolator region.

Figure 6D:
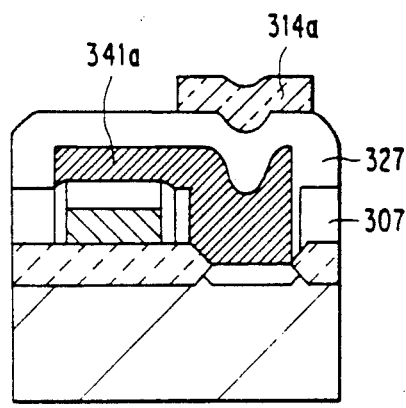
Figure 6E:
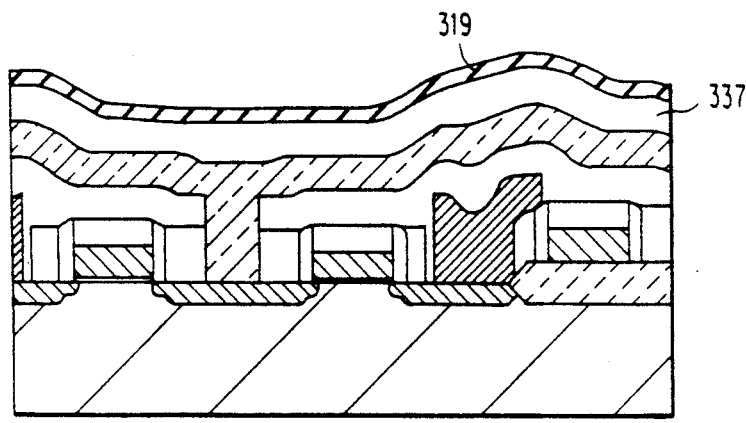
Figure 6F:
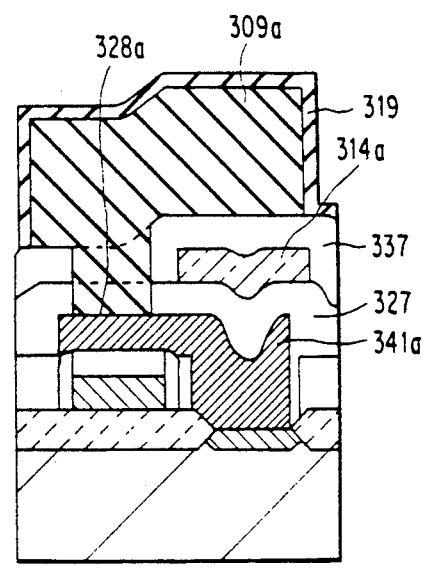

Now, as is shown in FIG. 5 and FIGS. 6c to 6d, a BPSG film 327 is deposited and then is heat-treated at about 850 centigrades. This becomes the second interlayer insulator film between word line and local wiring and has a thickness of 250 nanometers. By making a hole in the BPSG films 327 and the LTO film 307 on the first electrodes 306a and 306b by means of etching, the first contact holes 318a and 318b are constructed. The thickness of the insulator film composed of BPSG film 327 and the LTO film 307 at the aperture portion is about 650 nanometers. The step difference of aperture portion relative to the peripheral insulator film is less than 100 nanometers. Therefore, there is no difficulty in constructing the first contact hole. Next, a polycide film is deposited, the thickness of which is about 250 nanometers. The bit lines 314a and 314b are constructed by etching the polycide film. After tungsten or polysilicon is selectively deposited in the first contact hole, the polycide film may be deposited. On the surface of BPSG film 327 where the bit line is constructed, there is a shallow hollow only on the upper portion and its neighbor of the local contact hole. Except this area, the surface is nearly flat. Therefore, the working precision for the bit line is high.

Succeedingly, as is shown in FIG. 5 and FIGS. 6e and 6f, a BPSG film 337 is deposited and is heat-treated at about 850 centigrades. This becomes the third interlayer insulator film between bit line and cell capacitor and has a thickness of about 250 nanometers. By etching the BPSG films 337 and 327 on the other ends of the local wirings 341a and 341b, the second contact holes 328a and 328b are constructed on the other ends of local wirings 341a and 341b. The thickness of the insulator film composed of BPSG films 337 and 327 at the aperture portion is about 500 nanometers. A step difference of the aperture portion relative to the peripheral portion of the insulator film is about 250 nanometers. Therefore, as is similar to the construction of the first contact hole, the construction of the second contact hole can easily be made. On the second contact hole the lower electrodes 309a and 309c of a stacked cell capacitor of polysilicon, is constructed having a height of about 1.8 micrometers. Although the structure of it is fin type, it is shown more simplified. A capacitance insulator film (not shown) of about 5 nanometers calculated in terms of the silicon oxide film is deposited. The upper plate electrode 319 of stacked cell capacitor of N type polysilicon is constructed. The thickness of it is about 100 nanometers. Thus, the stacked cell capacitors 310a and 310b composed of the plate electrode, capacitance insulator film and lower electrode is constructed. The lower electrodes of cell capacitors 310a and 310b are connected to the second electrodes 316a and 316b through the second contact holes 318a and 318b, local wirings 341a and 341b, and local contact holes 308a and 308b, respectively. The explanation of the succeeding process will be omitted.

In the second embodiment, since the space between the word lines is flattened by means of the embedded insulator film, the local contact hole, first contact hole and second contact hole can be constructed more easily than in the first embodiment.

Although a P-type silicon substrate is used in the second embodiment, the above-mentioned semiconductor cell may be constructed on a P well fabricated on a silicon substrate.

Also, although the polysilicon, polycide and polysilicon are used as material for the word line, bit line and local wiring, respectively, they are not limited to the above-mentioned material.

Instead of the HTO film used as an insulator film covering the upper surface and side wall, other insulator films having an etching rate slower than BPSG film can be used.

Now, a semiconductor memory cell according to the third embodiment of the present invention will be explained with reference to FIGS. 7a and 7b, FIGS. 8a to 8f and FIGS. 9a to 9e. The semiconductor memory cell is a 1T memory cell of DRAM comprising a stacked memory cell capacitor disposed on the uppermost layer, and the bit line is disposed between the cell capacitor and the word line. The pattern design and the processing are performed by using the 0.4 micrometer rule. The cell size of the third embodiment is 1.8 micrometers×1.0 micrometer=1.8 square micrometers. In an article in IEDM Technical Digest, pp. 596 to 599 (1988), 3.6 square micrometers is realized by employing 0.5 micrometer rule. If the cell size of the present embodiment is converted into that calculated by 0.5 micrometer rule, it becomes 2.8 square micrometers. Therefore, the cell size is decreased by 78 percent.

Figure 7A:
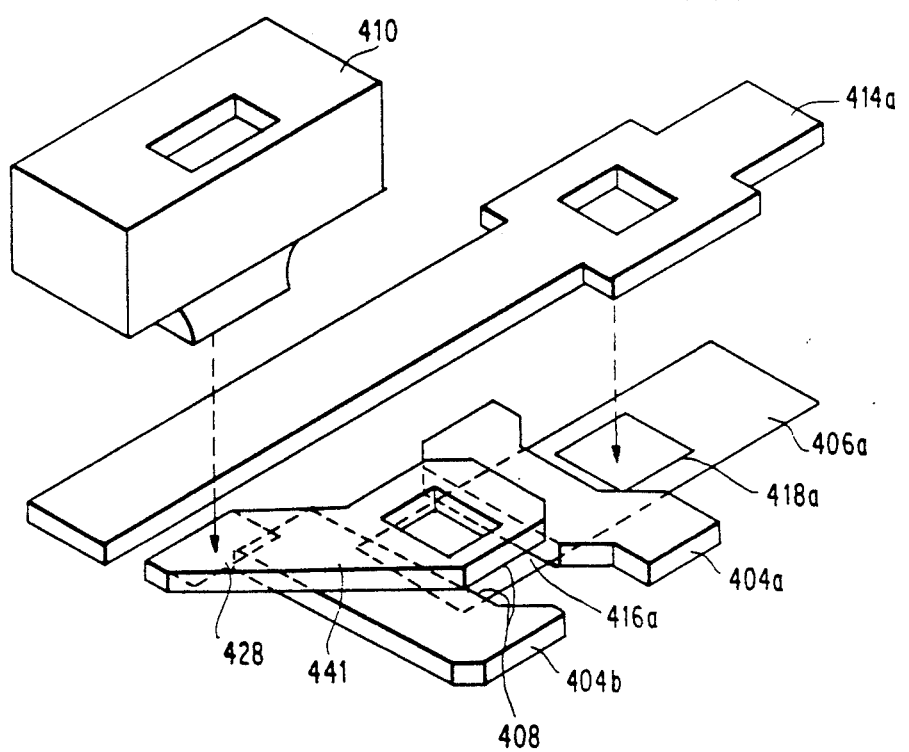
FIGS. 7a and 7b are a prespective view and a plain view for explaining a semiconductor memory cell according to the third embodiment of the present invention, respectively.
Figure 7B:
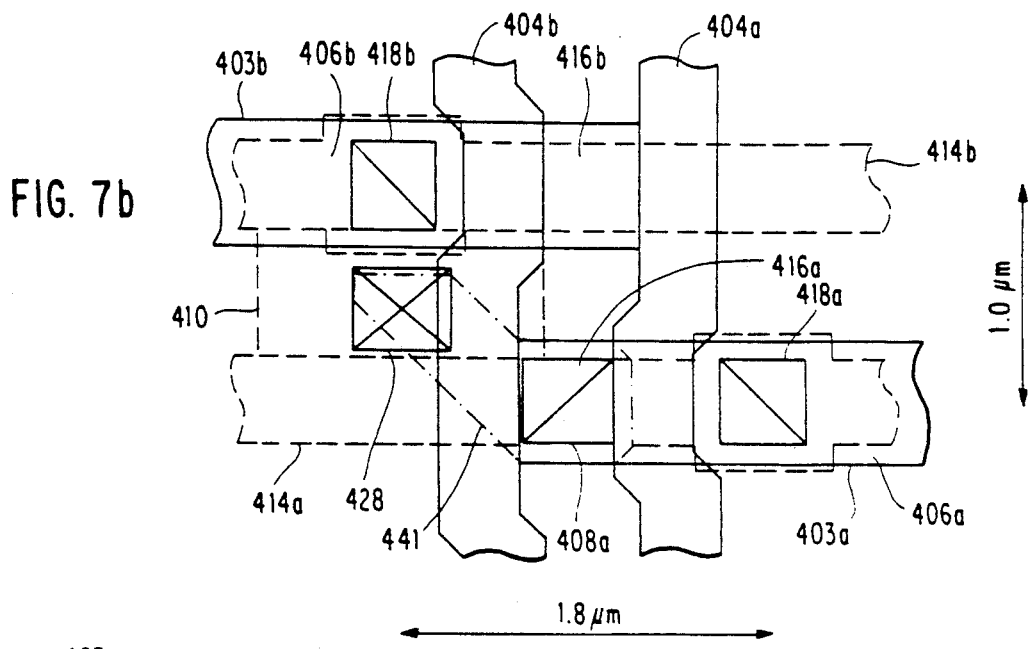

At first, the mutual connection between the transistor, the cell capacitor and the wiring will be explained with reference to FIGS. 7a and 7b. FIG. 7a is a brief perspective view showing one-bit memory cell. FIG. 7b is a brief plain view. A field oxide film deposited on the surface of a silicon substrate by, for example, the LOCOS method specifies a device isolator region and an active region. The transistors are constructed inside active region borders 403a and 403b separating device isolator region and active region. The word lines 404a and 404b are disposed nearly perpendicular to the longitudinal direction of the active region. The word lines 404a and 404b work as gate electrodes of the transistors as well. The transistors are constituted by these gate electrodes, the first electrodes 406a and 406b, and the second electrodes 416a, 416b of the N-type diffusion layer. The first contact holes 418a and 418b are constructed on the first electrodes 406a and 406b. The bit lines 414a and 414b are disposed in parallel with the longitudinal direction of the active region on the field oxide film. The bit line 414a is connected to the first electrode 406a through the first contact hole 418a, while the bit line 414b is connected to the first electrode 406b through the first contact hole 418b. The local contact holes 408a and 408b are disposed above the second electrodes 416a and 416b. The local wiring 441 is provided. One end of the local wiring 441 is connected to the second electrodes 416a and 416b through the local contact holes 408a and 408b, while the other end of it is disposed on the device isolator region, so that the local wiring 441 crosses the neighboring word line 404b. The second contact hole 428 is constructed on the other end of the local wiring 441. A cell capacitor 410 disposed between the bit lines is connected to the second electrode 416a through the second contact hole 428, local wiring 441 and local contact hole 408.

Next, the fabrication method of the semiconductor memory cell of the third embodiment of the present invention will be explained with reference to FIGS. 8a to 8f and FIGS. 9a to 9e. FIGS. 8a to 8f are brief layout diagrams for a 2 bit×2 bit memory. FIGS. 9a, 9b, 9c, 9d and 9e are the brief cross-sectional views along the single-dotted lines AA', BB', CC', DD' and EE' in FIG. 8f, respectively.

Figure 8A:
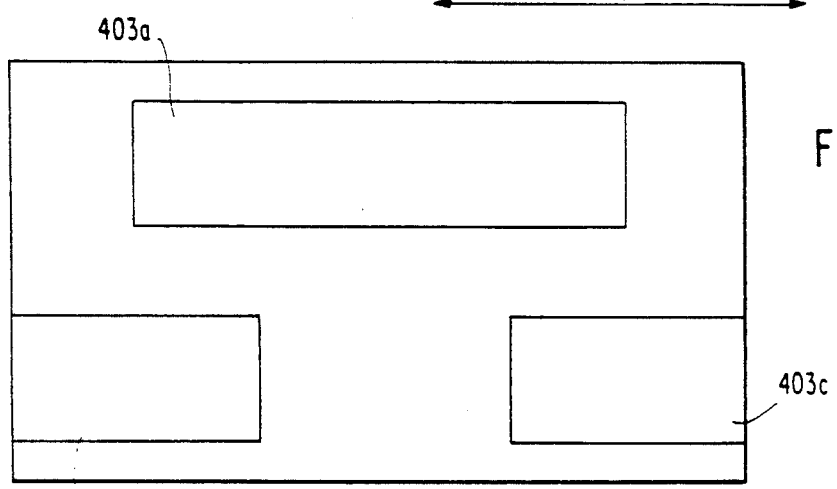
FIGS. 8a to 8f are layout diagrams for explaining the fabrication method of the semiconductor memory cell of the third embodiment of the present invention.
Figure 8B:
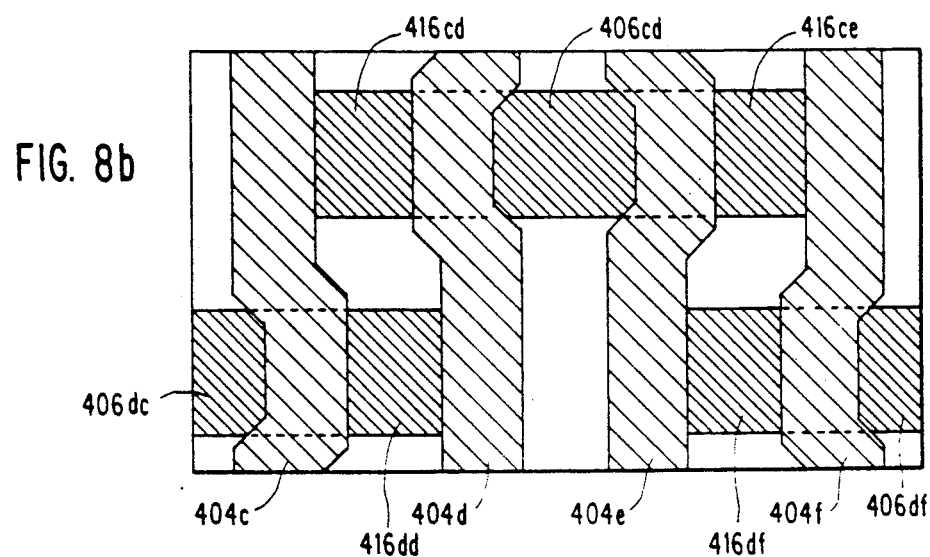
Figure 8C:
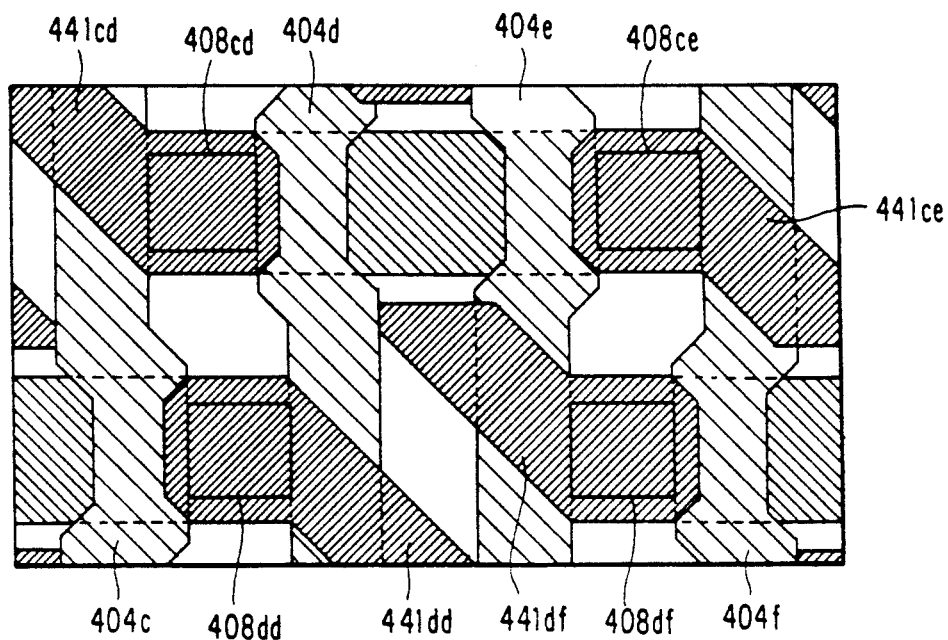
Figure 8D:
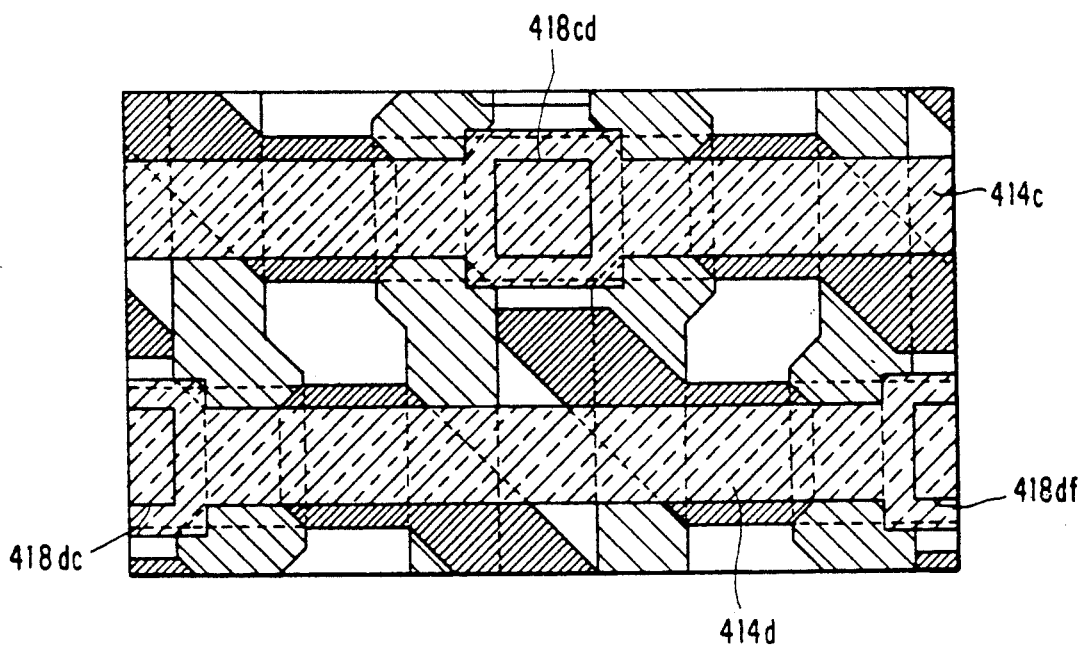
Figure 8E:
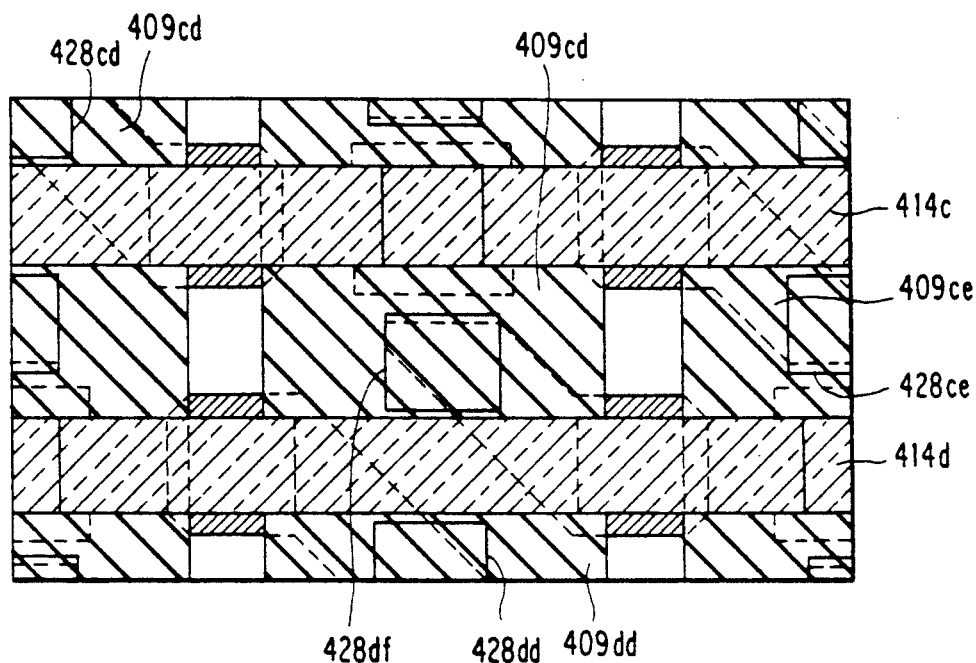
Figure 8F:
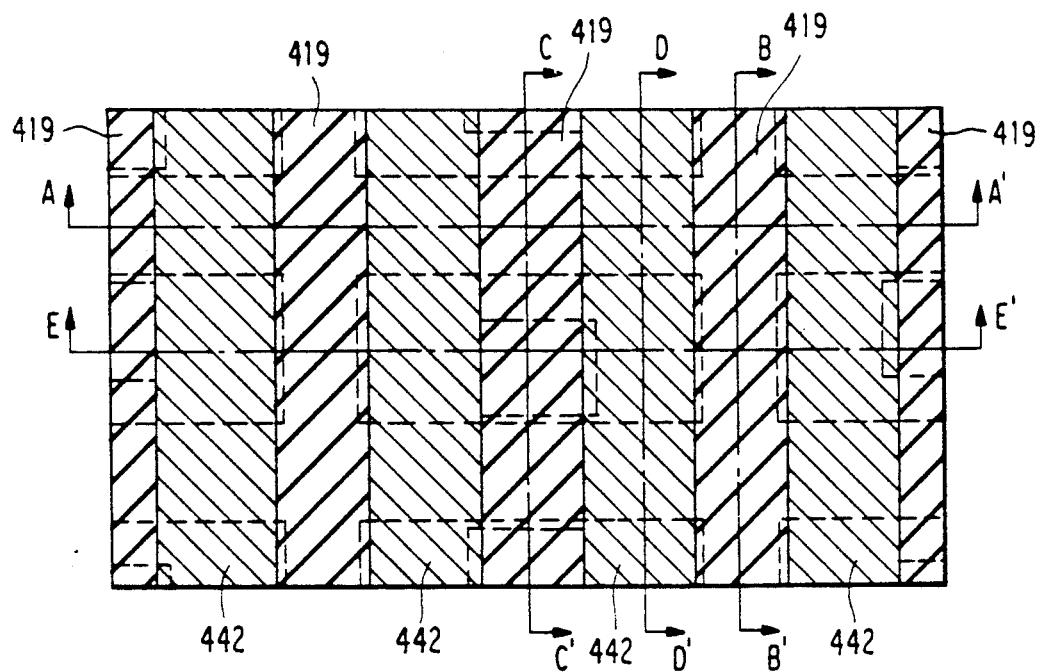
Figure 9A:
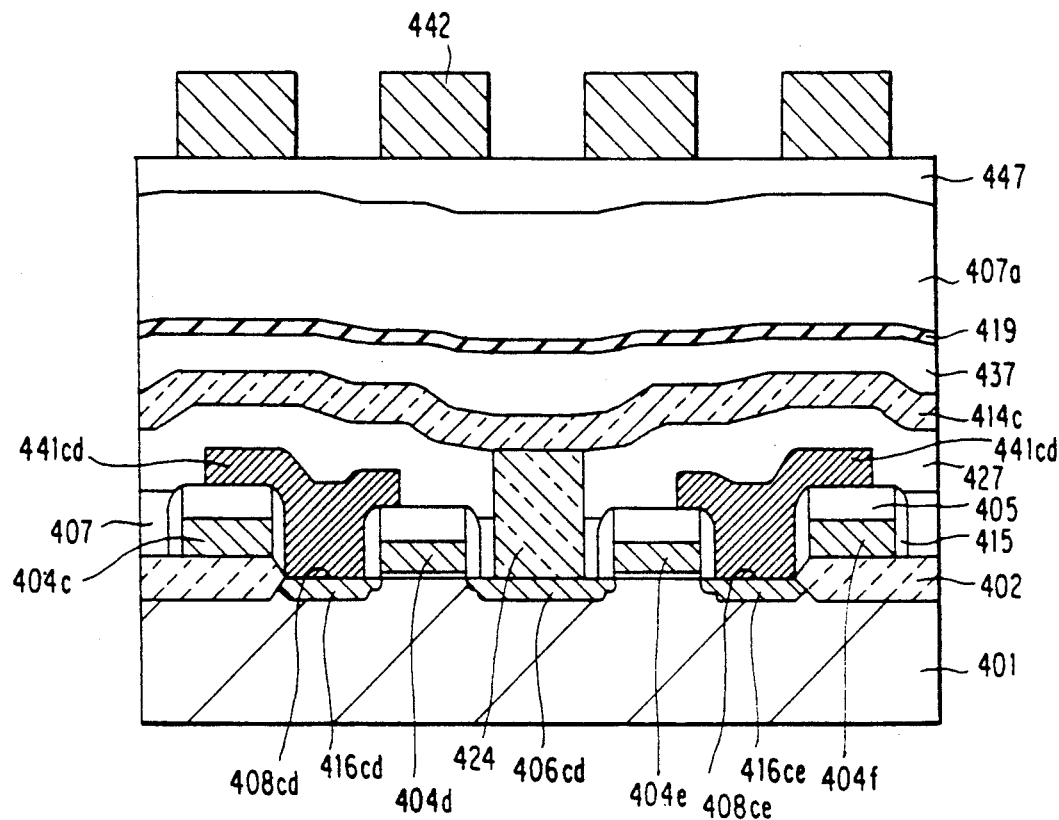
FIGS. 9a, 9b, 9c, 9d and 9e are brief sectional views along the single-dotted lines AA', BB', CC', DD' and EE' in FIG. 8f, respectively.
Figure 9B:
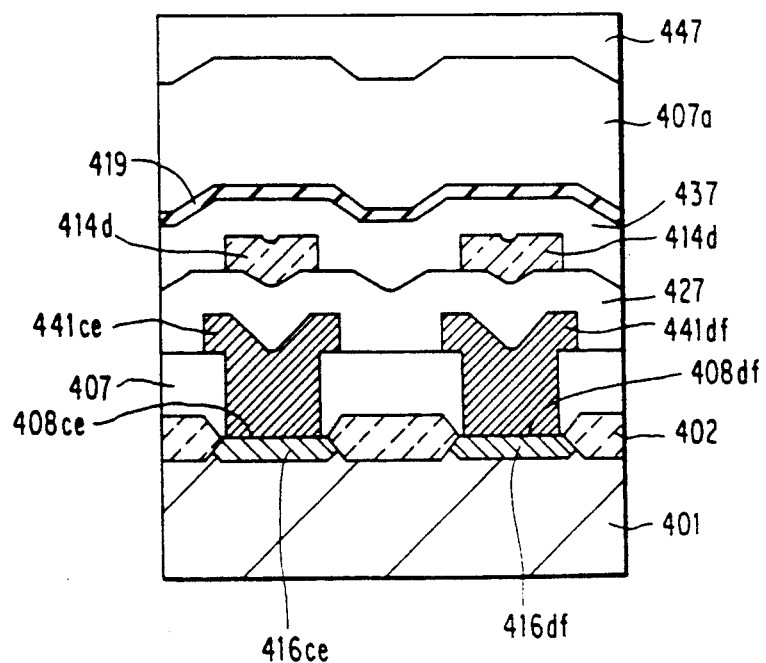
Figure 9C:
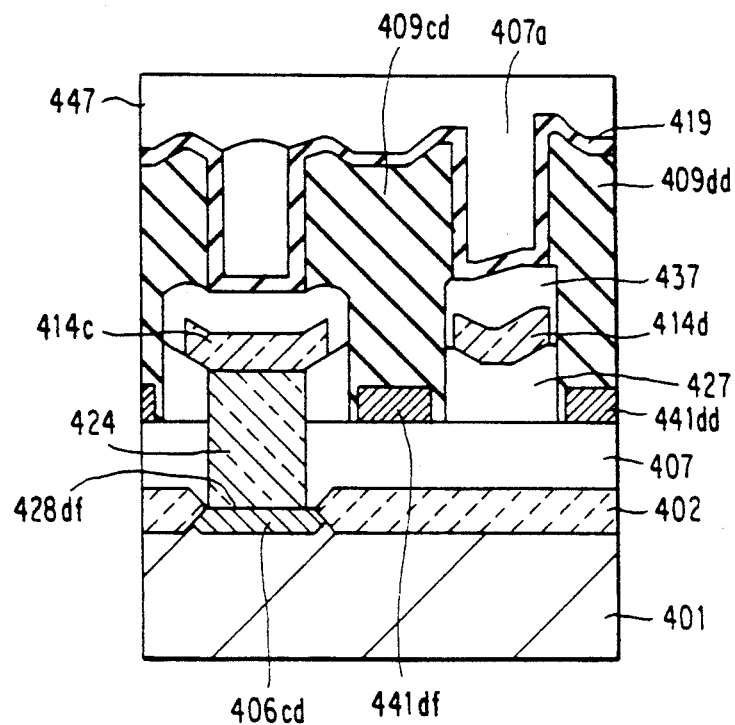
Figure 9D:
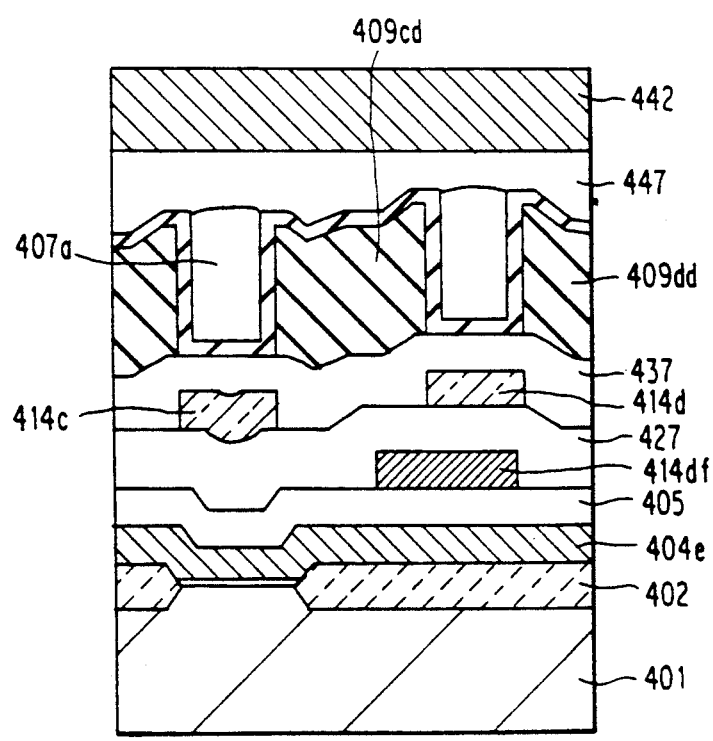
Figure 9E:
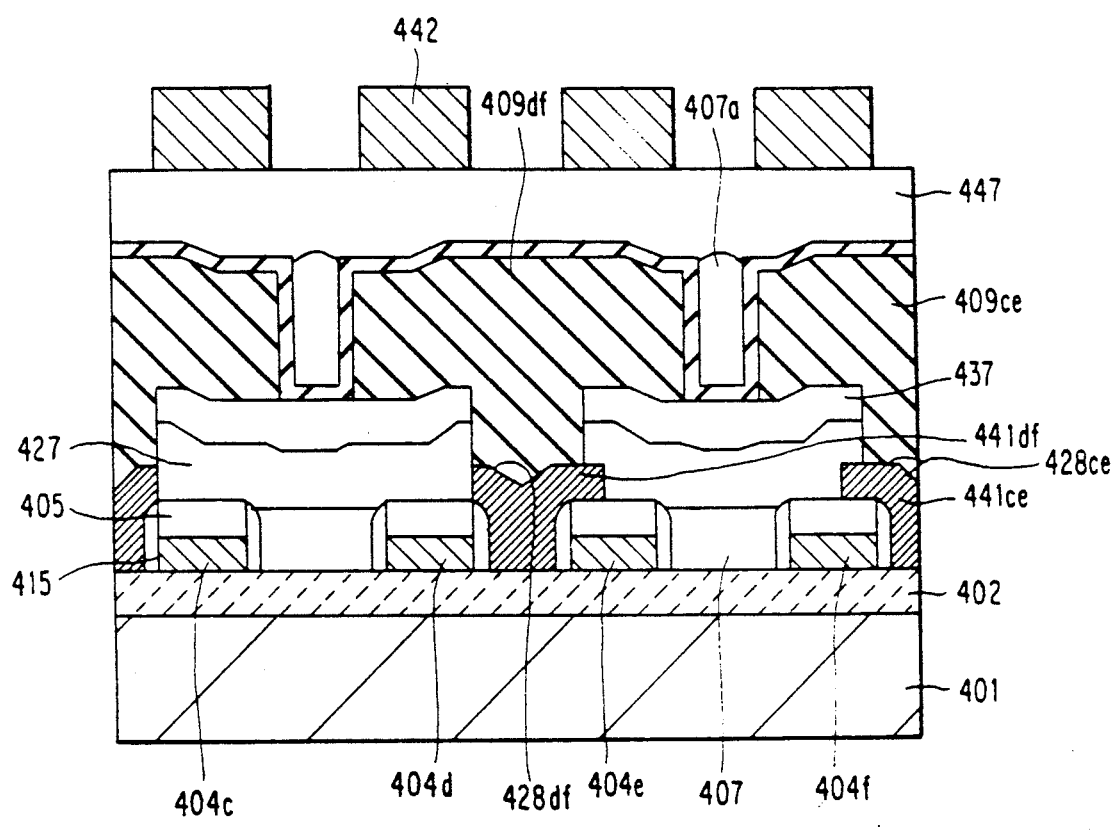

At first, as is shown in FIG. 8a and FIGS. 9a and 9e, a field oxide film 402 having a thickness of about 300 nanometers is deposited on, for example, a P-type silicon substrate 401 by means of, for example, the LOCOS method. The field oxide film 402 specifies a device isolator region and active region. Inside the active region borders 403a, 403b and 403c, two, one and one transistors are constructed, respectively.

As is shown in FIG. 8b, and FIGS. 9a to 9e, after depositing a gate insulator film having a thickness of about 10 nanometers calculated in terms of silicon oxide film, a N-type polysilicon film is deposited. The thickness of it is about 250 nanometers. Then, a HTO film 405 is deposited, the thickness of which is about 250 nanometers. The word lines 404c, 404d, 404e and 404f are constructed by processing the HTO film 405 and the N-type polysilicon film by means of photolithography. The width (that is, gate length) of it is 0.4 micrometers. A N$^-$ type diffusion layer is deposited by means of ion injection using word lines 404a, 404c, 404d, 404e and 404f as a mask. A side wall 415 of the HTO film is constructed at the sides of the word lines 404c, 404d, 404e and 404f with a thickness of about 100 nanometers. A N$^+$ type diffusion layer is deposited by means of ion injection. Thus, the first electrodes 406cd, 406dc, and 406df, and the second electrodes 416cd, 416ce, 416dd and 416df of the LDD structure are constructed.

Next, as is shown in FIG. 8c and FIGS. 9a to 9e, an embedded insulator film is deposited between the word lines. In this embodiment, a LTO film 407 is deposited. Then, the space between word lines are flattened by applying a paint of, for example, styrene and by etching back. The thickness of the LTO film 407 is about 450 nanometers. In this case, the oxide film deposition on the first and second electrodes is not performed. However, if the insulator film is deposited by means of plasma growth instead of the LTO film, the thermal oxide film deposition is preferable. The embedded insulator film must have the etching rate higher than the HTO films 405 and 415, but sufficiently slower than the BPSG film. By making a hole in the LTO film 407 above the second electrodes 416cd, 416ce, 416dd and 416df by means of a etching process, the local contact holes 408cd, 408ce, 408dd and 408df are constructed. Since the aperture portion of the LTO film 407 is nearly flat, the fabrication of the local contact hole is not difficult. A N-type polysiilcon film of about 250 nanometers is deposited. The deposition method of polysilicon film may be a combination of selective growth and normal growth methods. The local wirings 441cd, 441ce, 441dd and 441df are constructed by etching the polysilicon film. One end of the local wirings 441cd, 441ce, 441dd and 441df are connected to the second electrodes 416cd, 416ce, 416dd and 416df through local contact holes 408cd, 408ce, 408dd and 408df, respectively, while the other end of them exist above the device isolator region, so that the local wirings 441cd, 441ce, 441dd and 441df cross the neighboring word lines 404c, 404f, 404d and 404e. Under the other ends of them the word line does not exit.

Now, as is shown in FIG. 8d and FIGS. 9a to 9e, a BPSG film 427 is deposited and then is heat-treated at about 850 centigrades, which becomes the second interlayer insulator film between word line and local wiring. The thickness of it is 250 nanometers. By making a hole in the BPSG films 427 and the LTO film 407 on the first electrodes 406cd, 406dc, 406df by means of etching, the first contact holes 418cd, 418dc and 418df are constructed. The thickness of the insulator film composed of the BPSG film 427 and the LTO film 407 at the aperture portion is about 650 nanometers. The step difference of the aperture portion relative to the peripheral insulator film is less than 100 nanometers. Therefore, there is no difficulty in constructing the first contact hole. Inside the first electrode 406cd, 406dc, and 406df, an embedded polysilicon film 424 is deposited by means of selective growth. Instead, a tungsten film by selective growth can be used. Next, a polycide film is deposited, the thickness of which is about 250 nanometers. The bit lines 414c and 414d are constructed by etching the polycide film. On the surface of the BPSG film 327 where the bit line is constructed, there is a shallow hollow only on the upper portion and its neighbor of the local contact hole. Except for this area, the surface is nearly completely flat. Therefore, the working precision for the bit line is high.

Succeedingly, as is shown in FIG. 8e and FIGS. 9a to 9e, a BPSG film 437 is deposited and is heat-treated at about 850 centigrades, which becomes the third interlayer insulator film between bit line and cell capacitor. The thickness of it is about 250 nanometers. By etching the BPSG films 437 and 427 on the other ends of the local wirings 441cd, 441ce, 441dd and 441df, the second contact holes 428cd, 428ce, 428dd and 428df are constructed on the other ends of the local wirings 441cd, 441ce, 441dd and 441df, respectively. The thickness of the insulator film composed of the BPSG films 437 and 427 at the aperture portion is about 500 nanometers. A step difference of the aperture portion relative to the peripheral portion of the insulator film is about 100 nanometers. Therefore, as is similar to the construction of the first contact hole, the construction of the second contact hole can easily be made. On the second contact hole the lower electrodes 409cd, 409ce, 409dd and 409df of the stacked cell capacitor of polysilicon is constructed having a height of about 1.8 micrometers. Although the structure of it is fin type, it is shown more simplified. The lower electrodes 409cd, 409ce, 409dd and 409df of the cell capacitors are connected to the second electrodes 416cd, 416ce, 416dd and 416df through the second contact holes 428cd, 428ce, 428dd and 428df, local wirings, and local contact holes 408cd, 408ce, 408dd and 408df, respectively.

Finally, as is shown in FIG. 8f and FIGS. 9a to 9e, a capacitor insulator film (not shown) of about 5 nanometers calculated in terms of silicon oxide film, is deposited. A plate electrode 419 of N-type polysilicon is constructed, which is the upper electrode of stacked cell capacitor. The thickness of it is about 100 nanometers. A stacked capacitor is composed of a plate electrode, a capacitance insulator film and a lower electrode. A LTO film 407a is deposited in the slot between the cell capacitors as the second embedded insulator film. A SOG film 447 is deposited as the fourth interlayer insulator film between the cell capacitor and a wiring 442. The aluminum wiring 442 is connected to the word line 404 at a plurality of lead positions. The explanation of the succeeding process will be omitted.

In the third embodiment, the construction of local contact hole, the first contact hole and the second contact hole can easily be realized by flattening the space between the word lines by means of an embedded insulator film.

Although a P-type silicon substrate is used in the third embodiment, the above-mentioned semiconductor cell may be constructed on a P well fabricated on a silicon substrate.

Moreover, although polysilicon, polycide and polysilicon are used for the word line, bit line and local wiring, they are not limited to those materials.

As is explained above, in the semiconductor DRAM memory cell of the present invention comprising a stacked cell capacitor, the lower electrode is connected not directly to transistor but through the local wiring and the local contact hole. Consequently, the step difference between cell capacitor and transistor can be made small, with the result that the requirement for bit line pitch is relaxed. Due to this fact, the chip size can be reduced. Also, the freedom of the disposition of the cell capacitor can be obtained by utilizing the local wiring.

Although the invention has been described with reference to a specific embodiment, this description is not meant to be construed in a limiting sense. Various modifications of the disclosed embodiments, as well as other embodiments of the invention, will become apparent to persons skilled in the art upon reference to description of the invention. It is therefore contemplated that the appended claims will cover any modifications or embodiments that fall within the scope of the invention.

What is claimed is:

1. A semiconductor memory device formed on a semiconductor substrate comprising:
    a plurality of word lines, a plurality of bit lines, and a plurality of memory cells, each coupled to one of said word lines and one of said bit lines,
    a transistor having a gate, a first diffusion region, and a second diffusion region formed on an active region defined on a surface of said substrate, said active region being surrounded by an isolation region defined on said substrate, wherein an insulator film is formed on said isolation region, the gate of said transistor being formed of a part of an associated one of said word lines, the first diffusion region being connected to an associated one of said bit lines,
    a stacked cell capacitor being formed above said associated one of said word lines and said associated one of said bit lines, and having an upper electrode and a lower electrode, and
    means for connecting said lower electrode of said stacked capacitor to said second diffusion region, said connecting means including a local wiring, said local wiring having a first end portion connected to said second diffusion region with a first contact, said first contact being defined above said active region, said local wiring being extended beyond said active region over said insulator film to provide a second end portion located above said insulator film, said second end portion being connected to said lower electrode with a second contact, said second contact being defined above said isolation region laterally from said first contact in a direction parallel to the surface of said substrate, said bit line crossing said gate electrode and said local wiring above said active region.

2. A semiconductor memory device of claim 1, wherein the word line of the adjacent one of said memory cells is formed between said second end portion of said local wiring and said insulator film.

3. A semiconductor memory device of claim 1, wherein said local wiring crosses the word line of the adjacent one of said memory cells.

* * * * *

UNITED STATES PATENT AND TRADEMARK OFFICE
CERTIFICATE OF CORRECTION

PATENT NO. : 5,172,202

DATED : December 15, 1992

INVENTOR(S) : Kazuo Terada

It is certified that error appears in the above-indentified patent and that said Letters Patent is hereby corrected as shown below:

Column 7, line 36, delete "w" and insert --worsens --.

Signed and Sealed this

Twenty-eighth Day of December, 1993

Attest:

BRUCE LEHMAN

*Attesting Officer*        *Commissioner of Patents and Trademarks*